United States Patent
Huang et al.

(10) Patent No.: US 10,453,979 B2
(45) Date of Patent: Oct. 22, 2019

(54) EXTENDED SHORT-WAVE INFRARED STRAIN-LAYERED SUPERLATTICE ON INDIUM ARSENIDE SUBSTRATE AND ASSOCIATED METHODS

(71) Applicant: FLIR Systems, Inc., Wilsonville, OR (US)

(72) Inventors: Edward K. Huang, Thousand Oaks, CA (US); Andrew D. Hood, Ventura, CA (US)

(73) Assignee: FLIR SYSTEM, INC., Wilsonville, OR (US)

( * ) Notice: Subject to any disclaimer, the term of this patent is extended or adjusted under 35 U.S.C. 154(b) by 0 days.

(21) Appl. No.: 15/384,052

(22) Filed: Dec. 19, 2016

(65) Prior Publication Data

US 2017/0179317 A1    Jun. 22, 2017

Related U.S. Application Data

(60) Provisional application No. 62/269,631, filed on Dec. 18, 2015.

(51) Int. Cl.
| | |
|---|---|
| *H01L 31/0352* | (2006.01) |
| *H04N 5/33* | (2006.01) |
| *H01L 27/144* | (2006.01) |
| *H01L 31/18* | (2006.01) |
| *H01L 31/0304* | (2006.01) |
| *H01L 31/109* | (2006.01) |
| *H02S 40/44* | (2014.01) |

(52) U.S. Cl.
CPC .. *H01L 31/035263* (2013.01); *H01L 27/1446* (2013.01); *H01L 31/03046* (2013.01); *H01L 31/035236* (2013.01); *H01L 31/109* (2013.01); *H01L 31/1844* (2013.01); *H02S 40/44* (2014.12); *H04N 5/33* (2013.01)

(58) Field of Classification Search
CPC ....... H01L 31/035263; H01L 31/03036; H01L 31/109; H01L 27/1446; H01L 31/03046; H01L 31/035236; H01L 31/1844; H04N 5/33; H02S 40/44
USPC .......................................................... 257/21
See application file for complete search history.

(56) References Cited

U.S. PATENT DOCUMENTS

| | | | | |
|---|---|---|---|---|
| 5,594,750 | A * | 1/1997 | Zhang | ................. B82Y 20/00 257/14 |
| 9,799,785 | B1 * | 10/2017 | Ting | ............. H01L 31/035236 |
| 2016/0290865 | A1 * | 10/2016 | Delaunay | ............ H01L 31/0304 |

OTHER PUBLICATIONS

"Infrared Imaging: New IR detector materials challenge existing technologies" [online]. VisionSystems Design, Dec. 5, 2013, 5 pages [retrieved on Jan. 13, 2015]. Retrieved from the Internet: <URL:http://www.vision-systems.com/articles/print/volume-18/issue-11/departments/technology-trends/infrared-imaging-new-ir-detector-materials-challenge-existing-technologies.html>.

* cited by examiner

*Primary Examiner* — Tong-Ho Kim
(74) *Attorney, Agent, or Firm* — Haynes and Boone, LLP

(57) ABSTRACT

Materials and methods may be provided for short-wave infrared (SWIR) superlattice materials. The superlattice material includes a first sub-layer comprising InAs, and a second sub-layer adjacent to the first sub-layer including AlSb, AlAsSb, or InAlAsSb.

20 Claims, 11 Drawing Sheets

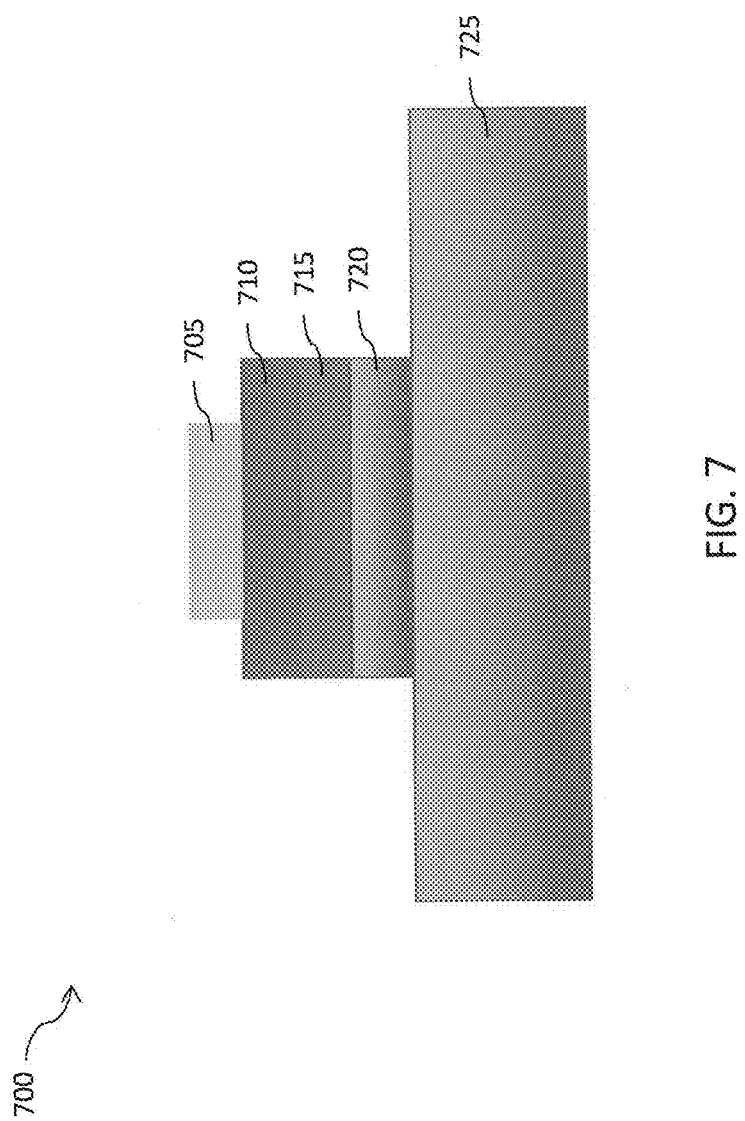

EXTENDED SHORT-WAVE INFRARED STRAIN-LAYERED SUPERLATTICE ON INDIUM ARSENIDE SUBSTRATE AND ASSOCIATED METHODS

CROSS-REFERENCE TO RELATED APPLICATIONS

This patent application claims the benefit of and priority to U.S. Provisional Patent Application No. 62/269,631 filed Dec. 18, 2015 and entitled "EXTENDED SHORT-WAVE INFRARED STRAIN-LAYERED SUPERLATTICE ON INDIUM ARSENIDE SUBSTRATE AND ASSOCIATED METHODS," which is incorporated herein by reference in its entirety.

STATEMENT REGARDING GOVERNMENT SUPPORT

This invention was made with government support under FA8650-14-C-5401 awarded by the United States Air Force. The government has certain rights in the invention.

TECHNICAL FIELD

One or more embodiments of the invention relate generally to infrared detectors and, more particularly, for example, to a strain-layered superlattice composed of an indium arsenide (InAs) substrate, and InAs and aluminum antimonide (AlSb), aluminum arsenide antimonide (AlAsSb), or indium aluminum arsenic antimony (InAlAsSb) quantum wells.

BACKGROUND

The infrared spectrum covers a wide range of wavelengths that are longer than the visible wavelengths, but shorter than the microwave wavelengths. The short-wave infrared (SWIR) wavelengths cover the range of about one to three microns ($\mu m$), and certain types of infrared detectors are designed to respond to the energy of wavelengths within the SWIR portion of the infrared region.

An existing material used for manufacturing SWIR focal plane arrays is indium gallium arsenide (InGaAs). State-of-the-art SWIR material is based on bulk and lattice matched InGaAs grown on indium phosphide (InP) substrates, which has a cut-off wavelength of about 1.7 $\mu m$ at 300K. For applications that require a longer cut-off wavelength in the 2 $\mu m$ to 3 $\mu m$ range, and in keeping with the InGaAs material system, a lattice-mismatched (relative to InP) InGaAs alloy with a higher indium composition is needed. This approach, however, degrades performance.

An alternative approach is a strain-layered superlattice using indium gallium arsenide (InGaAs) and gallium arsenide antimonide (GaAsSb) quantum wells. This material system is attractive in that the cut-off wavelength is tunable by extending or shortening the quantum well periods while remaining lattice matched to InP. To extend the spectral cut-off to the 2 $\mu m$ to 3 $\mu m$ range, however, the superlattice period must be lengthened dramatically, resulting in weakened coupling of the quantum wells, and a significant drop in the absorption coefficient is observed based on theoretical modeling.

As a result, there is a need for improved techniques for extended strain-layered superlattice materials and methods.

SUMMARY

The present disclosure describes in accordance with one or more embodiments a new family of strain-layered superlattice (SLS) that is composed of InAs and AlSb, AlAsSb or AlInAsSb quantum wells, which are closely matched to the InAs substrate. Theoretical modeling has shown general cut-off tunability of this system, for example, to be between about 1.3-3 $\mu m$, which covers the whole range of the extended SWIR waveband. Cut-off can be tuned for example for one or more embodiments simply by changing the period thickness of the SLS composed of alloys closely matched to InAs. Modeling has also shown a comparable absorption coefficient to extended wavelength InGaAs, and in some cases, possibly better than the InGaAs alloy. Infrared detectors that can incorporate the SLS include those containing an n-type absorber, including PIN (p-doped semiconductor layer, intrinsic detector layer, and an n-doped semiconductor layer), PBN (p-doped semiconductor layer, barrier layer, and n-doped semiconductor layer), and NBN (n-doped semiconductor layer, barrier layer, and n-doped semiconductor layer) designs.

According to an embodiment, an infrared detector is disclosed. The infrared detector includes a first sub-layer comprising InAs and a second sub-layer adjacent to the first sub-layer comprising AlSb, AlAsSb, or InAlAsSb.

According to another embodiment, a structure including a superlattice layer including a plurality of periods is disclosed. Each of the plurality of periods include a first sub-layer comprising InAs and a second sub-layer adjacent to the first sub-layer comprising AlSb, AlAsSb, or InAlAsSb.

According to another embodiment, a method is disclosed. The method includes providing an InAs substrate, depositing InAs on the InAs substrate, and depositing AlSb, AlAsSb, or InAlAsSb on the InAs to form a strained-layer superlattice.

The scope of the invention is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

design, $In_{0.84}Ga_{0.16}As$, and $In_{0.53}Ga_{0.47}As/GaAs_{0.5}Sb_{0.5}$ on an InP substrate in accordance with an embodiment.

Figure 6A:
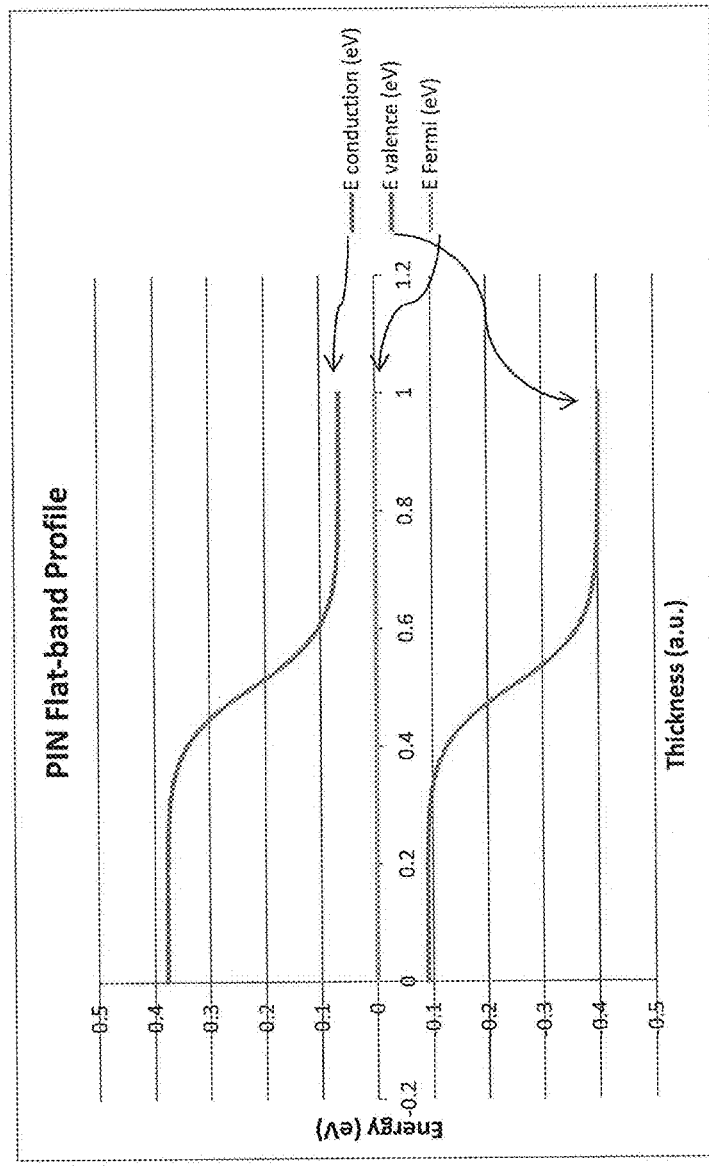

FIG. 6A shows a flat-band profile of a PIN detector containing a strain-layered superlattice (SLS) structure in accordance with an embodiment.

Figure 6B:
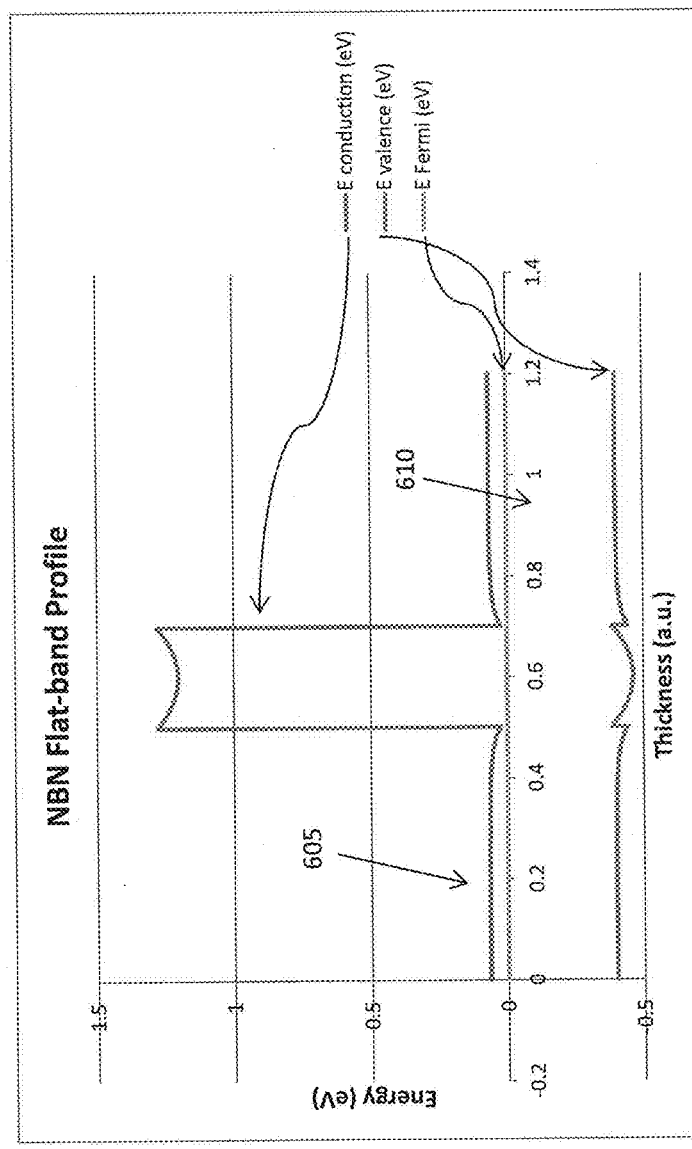

FIG. 6B shows a flat-band profile of an NBN detector containing a strain-layered superlattice (SLS) structure in accordance with an embodiment.

FIG. 7 shows an etched PBN diode containing a strain-layered superlattice (SLS) structure in accordance with an embodiment.

Figure 8:
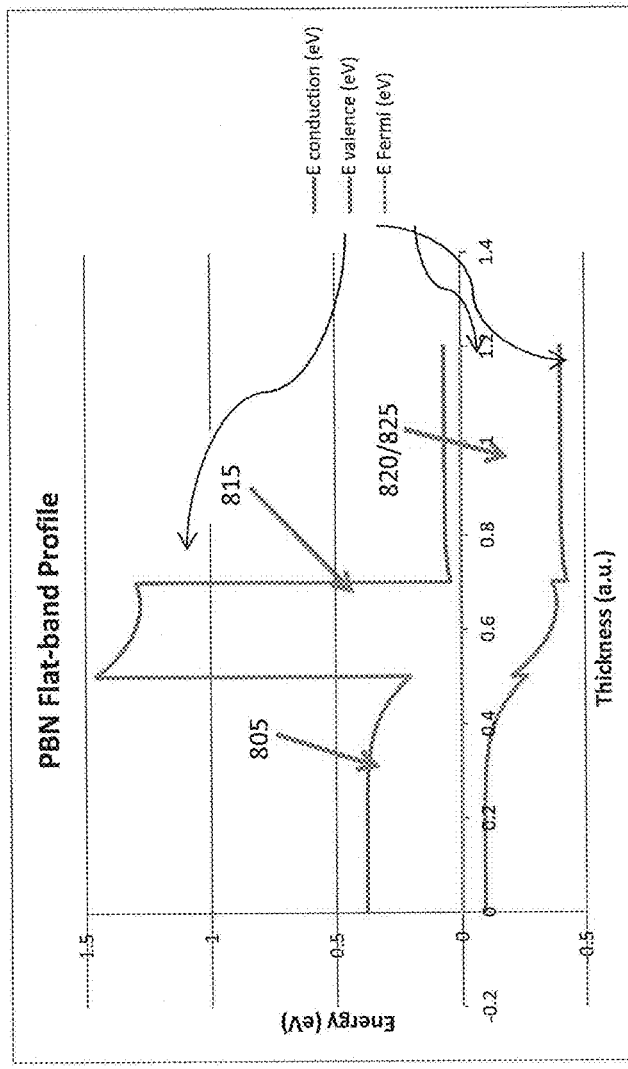

FIG. 8 shows a flat-band profile of a PBN detector containing the PBN diode of FIG. 7 in accordance with an embodiment.

Embodiments of the invention and their advantages are best understood by referring to the detailed description that follows. It should be appreciated that like reference numerals are used to identify like elements illustrated in one or more of the figures.

DETAILED DESCRIPTION

Materials, systems, and methods are disclosed herein in accordance with one or more embodiments that provide a strain-layered superlattice (SLS) that extends the cut-off wavelength of an infrared detector to about 1.3-3 μm, which covers the full range of the extended SWIR waveband. A "superlattice" as used herein means a series of two or more alternating sub-layers of different material and may define, for example, either matched or strain layers.

The superlattice structures described herein may be provided in the absorber region of infrared detector devices. It should be understood that the infrared detector devices may be provided in an array to form an imaging device, such as a focal plane array. The infrared detector devices can detect infrared wavelengths in the range of about 1 to 3 μm.

Figure 1:
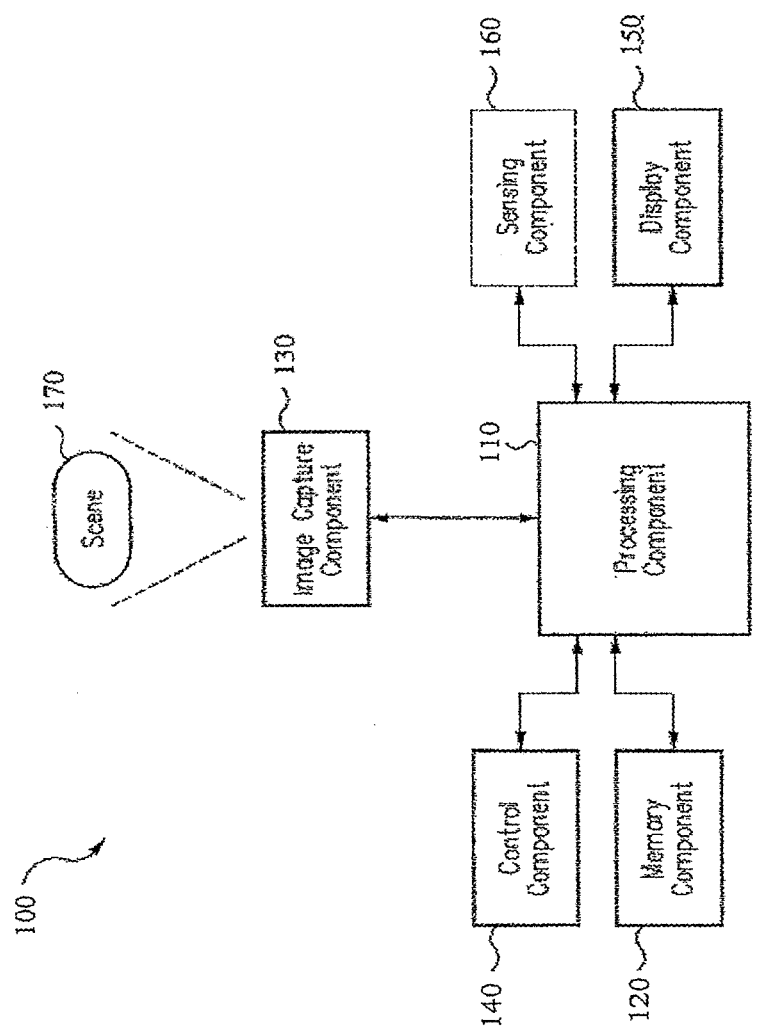
FIG. 1 shows a block diagram illustrating a system for capturing images in accordance with an embodiment.

Referring now to FIG. 1, a block diagram is shown illustrating a system 100 (e.g., an infrared camera) for capturing and processing images in accordance with one or more embodiments. System 100 may include, in one implementation, a processing component 110, a memory component 120, an image capture component 130, a control component 140, and a display component 150. Optionally, system 100 may include a sensing component 160.

System 100 may represent for example an infrared imaging device, such as an infrared camera, to capture and process images, such as video images of a scene 170. The system 100 may represent any type of infrared camera adapted to detect infrared radiation and provide representative data and information (e.g., infrared image data of a scene) or may represent more generally any type of electro-optical sensor system. System 100 may comprise a portable device and may be incorporated, e.g., into a vehicle (e.g., an automobile or other type of land-based vehicle, an aircraft, a marine craft, or a spacecraft) or a non-mobile installation requiring infrared images to be stored and/or displayed or may comprise a distributed networked system.

In various embodiments, processing component 110 may comprise any type of a processor or a logic device (e.g., a programmable logic device (PLD) configured to perform processing functions). Processing component 110 may be adapted to interface and communicate with components 120, 130, 140, and 150 to perform method and processing steps and/or operations, as described herein such as controlling biasing and other functions along with conventional system processing functions as would be understood by one skilled in the art.

Memory component 120 comprises, in one embodiment, one or more memory devices adapted to store data and information, including for example infrared data and information. Memory device 120 may comprise one or more various types of memory devices including volatile and non-volatile memory devices. Processing component 110 may be adapted to execute software stored in memory component 120 so as to perform method and process steps and/or operations described herein.

Image capture component 130 comprises, in one embodiment, any type of image sensor, such as for example one or more infrared sensors (e.g., any type of multi-pixel infrared detector) for capturing infrared image data (e.g., still image data and/or video data) representative of an image, such as scene 170. In one implementation, the infrared sensors of image capture component 130 provide for representing (e.g., converting) the captured image data as digital data (e.g., via an analog-to-digital converter included as part of the infrared sensor or separate from the infrared sensor as part of system 100). In one aspect, the infrared image data (e.g., infrared video data) may include non-uniform data (e.g., real image data) of an image, such as scene 170. Processing component 110 may be adapted to process the infrared image data (e.g., to provide processed image data), store the infrared image data in memory component 120, and/or retrieve stored infrared image data from memory component 120. For example, processing component 110 may be adapted to process infrared image data stored in memory component 120 to provide processed image data and information (e.g., captured and/or processed infrared image data).

In one or more embodiments, image capture component 130 may include absorption detector elements comprising superlattice structures for detecting, for example, infrared radiation in the SWIR wavelengths. In one embodiment, the superlattice structures include InAs and AlSb, AlAsSb, or InAlAsSb quantum wells.

Control component 140 may include, in one embodiment, a user input and/or interface device, such as a rotatable knob (e.g., potentiometer), push buttons, slide bar, keyboard, etc., that is adapted to generate a user input control signal. Processing component 110 may be adapted to sense control input signals from a user via control component 140 and respond to any sensed control input signals received therefrom. Processing component 110 may be adapted to interpret such a control input signal as a parameter value, as generally understood by one skilled in the art.

In one embodiment, control component 140 may include a control unit (e.g., a wired or wireless handheld control unit) having push buttons adapted to interface with a user and receive user input control values. In one implementation, the push buttons of the control unit may be used to control various functions of the system 100, such as autofocus, menu enable and selection, field of view, brightness, contrast, noise filtering, high pass filtering, low pass filtering, and/or various other features as understood by one skilled in the art.

Display component 150 may include, in one embodiment, an image display device (e.g., a liquid crystal display (LCD) or various other types of generally known video displays or monitors). Processing component 110 may be adapted to display image data and information on the display component 150. Processing component 110 may be adapted to retrieve image data and information from memory component 120 and display any retrieved image data and information on display component 150. Display component 150 may include display electronics, which may be utilized by processing component 110 to display image data and information (e.g., infrared images). Display component 150 may be adapted to receive image data and information directly from image capture component 130 via the processing component 110, or the image data and information may be transferred from memory component 120 via processing component 110.

Optional sensing component 160 may include, in one embodiment, one or more sensors of various types, depending on the application or implementation requirements, as would be understood by one skilled in the art. The sensors of optional sensing component 160 provide data and/or information to at least processing component 110. In one aspect, processing component 110 may be adapted to communicate with sensing component 160 (e.g., by receiving sensor information from sensing component 160) and with image capture component 130 (e.g., by receiving data and information from image capture component 130 and providing and/or receiving command, control, and/or other information to and/or from one or more other components of system 100).

In various implementations, sensing component 160 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder), and/or whether a tunnel or other type of enclosure has been entered or exited. Sensing component 160 may represent conventional sensors as generally known by one skilled in the art for monitoring various conditions (e.g., environmental conditions) that may have an effect (e.g., on the image appearance) on the data provided by image capture component 130.

In some implementations, optional sensing component 160 (e.g., one or more of sensors) may include devices that relay information to processing component 110 via wired and/or wireless communication. For example, optional sensing component 160 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques.

In various embodiments, components of system 100 may be combined and/or implemented or not, as desired or depending on the application or requirements, with system 100 representing various functional blocks of a related system. In one example, processing component 110 may be combined with memory component 120, image capture component 130, display component 150, and/or optional sensing component 160. In another example, processing component 110 may be combined with image capture component 130 with only certain functions of processing component 110 performed by circuitry (e.g., a processor, a microprocessor, a logic device, a microcontroller, etc.) within image capture component 130. Furthermore, various components of system 100 may be remote from each other (e.g., image capture component 130 may comprise a remote sensor with processing component 110, etc. representing a computer that may or may not be in communication with image capture component 130).

Figure 2:
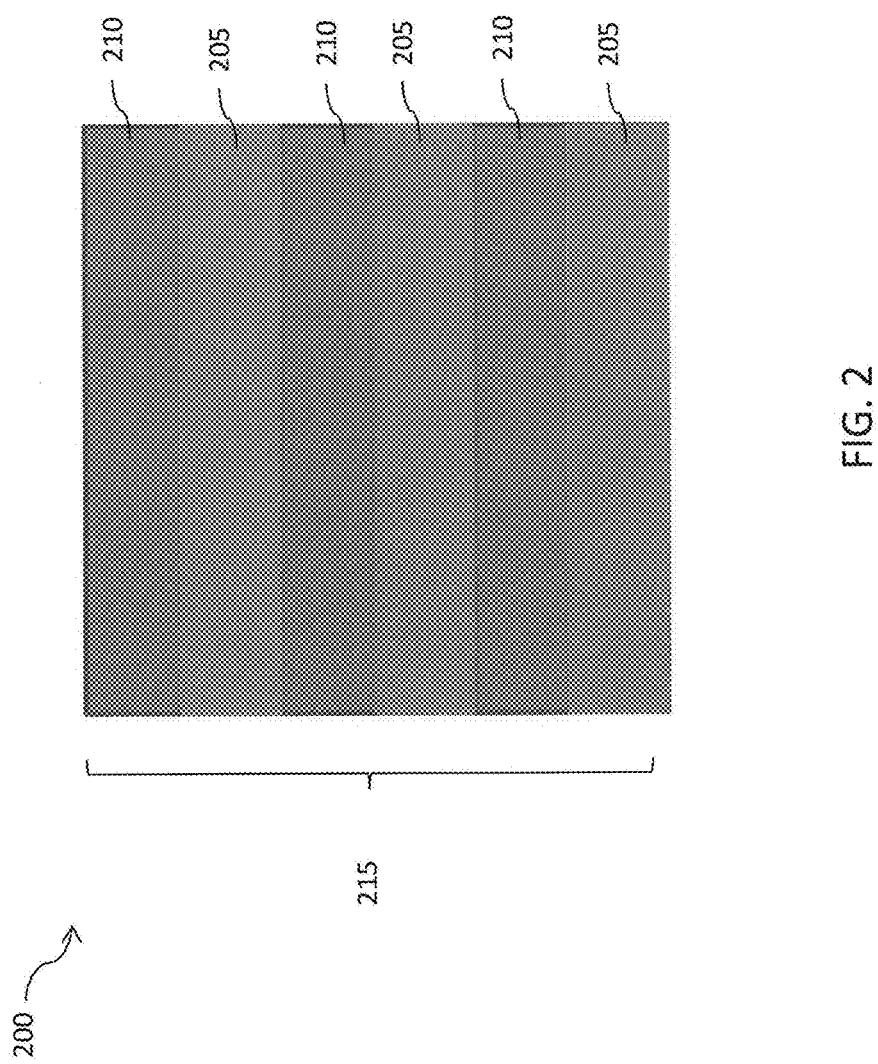
FIG. 2 shows a strained-layer superlattice (SLS) structure in accordance with an embodiment.

Referring now to FIG. 2, a SLS structure 200 is illustrated. The SLS structure 200 has a period 215 defined by a first InAs sub-layer 205 and a second AlSb, AlAsSb, or InAlAsSb sub-layer 210 adjacent to the sub-layer 205. The period 215 may contain any number of sub-layer 205 and sub-layer 210. The InAs sub-layer typically acts as a quantum well for electrons, while AlSb, AlAsSb, or InAlAsSb sub-layer acts as a quantum well for holes. The period 215 may repeat any number of times in a device. The total number of repetitions depends on the absorption coefficient and carrier transport properties of the material to maximize device quantum efficiency.

The thickness of the InAs sub-layer 205 and AlSb, AlAsSb, or InAlAsSb sub-layer 210 are any suitable thicknesses for the application. In various embodiments, the thickness of the InAs sub-layer 205 ranges from about 10 to 50 angstroms. In an exemplary embodiment, the thickness of the InAs sub-layer 205 is about 30 angstroms (e.g., 28 angstroms). In some embodiments, the thickness of the AlSb, AlAsSb, or InAlAsSb sub-layer 210 ranges from about 10 to 30 angstroms. In an exemplary embodiment, the thickness of the AlSb, AlAsSb, or InAlAsSb sub-layer 210 is about 12 angstroms.

The AlAsSb and InAlAsSb alloys may be present in the sub-layer 210 as any suitable alloy including $AlAs_xSb_{1-x}$, where x is greater than 0 and less than 1, and $In_xAl_{1-x}As_ySb_{1-y}$, where x and y are greater than 0 and less than 1. In exemplary embodiments, the AlAsSb is present as $AlAs_{0.16}Sb_{0.84}$, or the InAlAsSb is present as $In_{0.2}Al_{0.8}As_{0.3}Sb_{0.7}$, $In_{0.5}Al_{0.5}As_{0.5}Sb_{0.5}$, or $In_{0.5}Al_{0.5}As_{0.57}Sb_{0.43}$.

The SLS structures are formed by selective deposition of thin layers of semiconductor materials one above the other in a stacked arrangement to create a plurality of heterojunctions in the vertical or stacking direction. The periodic quantum wells create local confinement of carriers and an effective bandgap or cut-off wavelength dependent on the sub-layer thicknesses.

Figure 3:
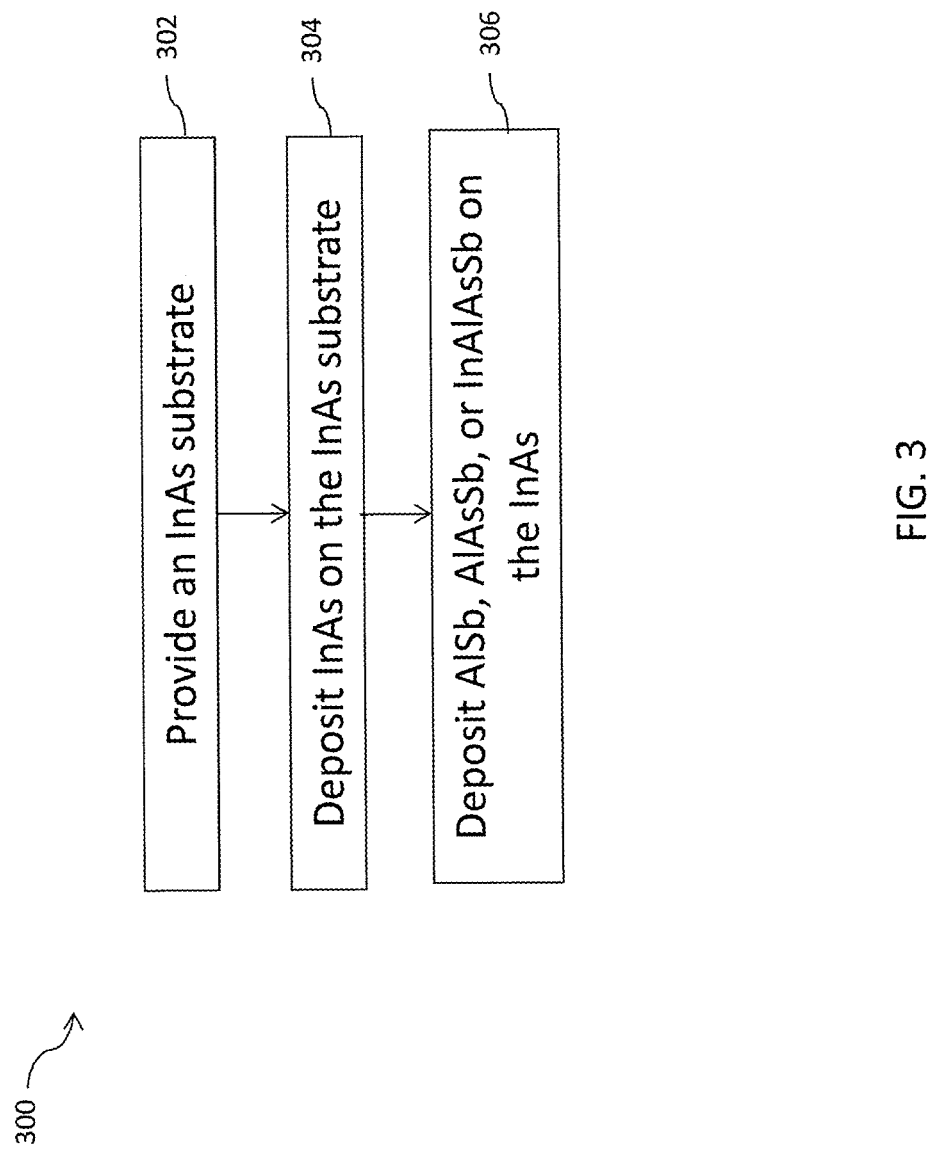
FIG. 3 shows a flow diagram illustrating a method of fabricating a strain-layered superlattice (SLS) in accordance with an embodiment.

Turning now to FIG. 3, a method 300 for fabricating a SLS structure is described. At step 302, an InAs substrate is provided. At step 304, InAs is deposited on the InAs substrate. At step 306, AlSb, AlAsSb, or InAlAsSb is deposited on the InAs.

The various sub-layers described and shown herein can be formed using any suitable method. For example, the sub-layers can be epitaxially grown using molecular beam epitaxy (MBE), metallo organic chemical vapor deposition (MOCVD), and/or migration enhanced MOCVD (MEMO-CVD).

Figure 4A:
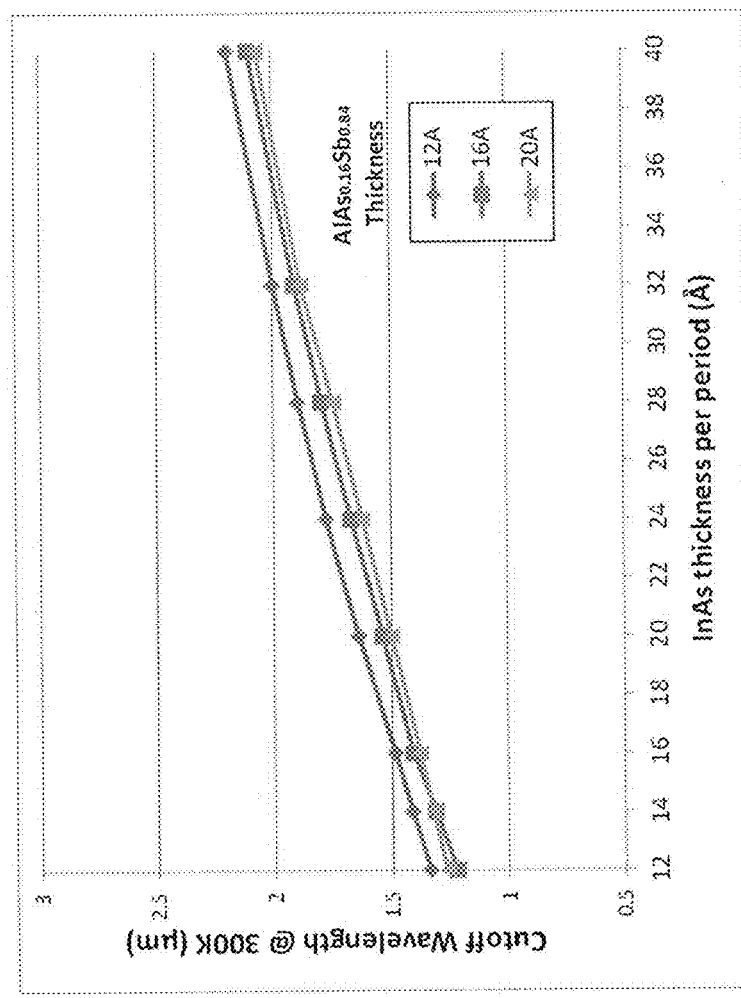
FIG. 4A shows a graph illustrating the cut-off wavelength at 300K as a function of thickness of sub-layers of a strain-layered superlattice (SLS) design for InAs/AlAs$_{0.16}$Sb$_{0.84}$ in accordance with an embodiment.

The cut-off wavelength of the SLS can be tuned by changing the sub-layer thickness of the SLS. Referring now to FIG. 4A, a graph displaying cut-off wavelength at 300K as a function of the thickness of a SLS design for InAs/$AlAs_{0.16}Sb_{0.84}$ sub-layers is provided. One can see that as the thickness of an InAs sub-layer is increased, the cut-off wavelength also increases. In this specific embodiment, one InAs sub-layer was present per period. In contrast, as the thickness of the $AlAs_{0.16}Sb_{0.84}$ sub-layer is increased, the cut-off wavelength decreases. In this specific embodiment, one $AlAs_{0.16}Sb_{0.84}$ sub-layer was present per period. The cut-off wavelength for a SLS having a 40 angstrom thick InAs sub-layer and 12 angstrom thick $AlAs_{0.16}Sb_{0.84}$ sub-layer layer is close to 2.3 μm. By varying the thickness of the InAs and $AlAs_{0.16}Sb_{0.84}$ sub-layers, the cut-off wavelength can be tuned in the range of about 1.3 μm to about 2.3 μm.

Figure 4B:
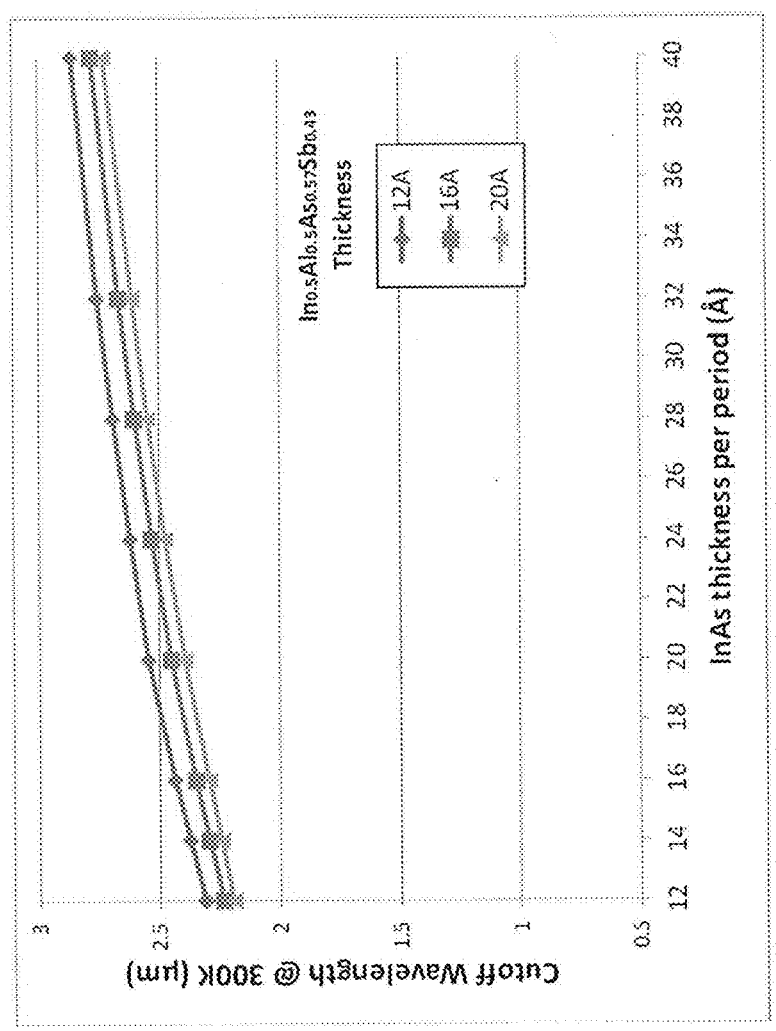
FIG. 4B shows a graph illustrating the cut-off wavelength at 300K as a function of thickness of sub-layers of a strain-layered superlattice (SLS) design for InAs/In$_{0.5}$Al$_{0.5}$As$_{0.57}$Sb$_{0.0.43}$ in accordance with an embodiment.

FIG. 4B illustrates the cut-off wavelength at 300K as a function of thickness of sub-layers in a SLS design for InAs/$In_{0.5}Al_{0.5}As_{0.57}Sb_{0.43}$. The cut-off wavelength increases as the thickness of the InAs sub-layer increases and as the thickness of the $In_{0.5}Al_{0.5}As_{0.57}Sb_{0.43}$ sub-layer decreases. In this specific embodiment, there was one InAs sub-layer and one $In_{0.5}Al_{0.5}As_{0.57}Sb_{0.43}$ sub-layer per period. By varying the thickness of the InAs and $In_{0.05}Al_{0.5}As_{0.57}Sb_{0.43}$ sub-layers, the cut-off wavelength can be tuned in the range of about 2.3 μm to close to about 3 μm.

Figure 4C:
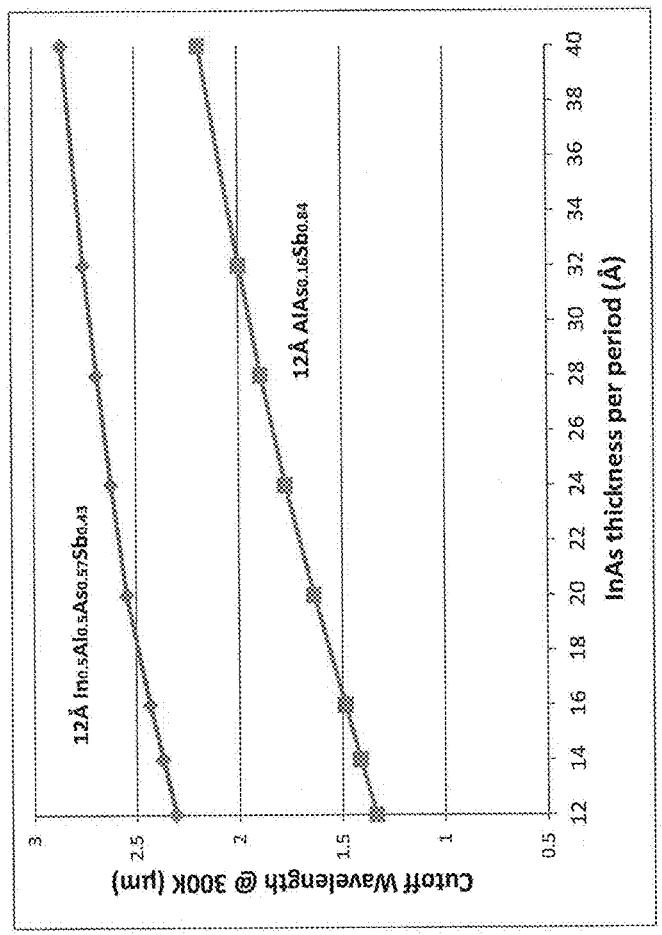
FIG. 4C shows a graph illustrating the cut-off wavelength at 300K as a function of thickness of sub-layers of a strain-layered superlattice (SLS) design for InAs/AlAs$_{0.16}$Sb$_{0.84}$ and InAs/In$_{0.5}$Al$_{0.5}$As$_{0.57}$Sb$_{0.43}$ in accordance with an embodiment.

FIG. 4C illustrates the cut-off wavelength at 300 K as a function of SLS design for $InAs/In_{0.5}Al_{0.5}As_{0.57}Sb_{0.43}$ and $InAs/AlAs_{0.16}Sb_{0.84}$. The cut-off wavelength increases as the thickness of the InAs sub-layer increases. The thickness of the $In_{0.5}Al_{0.5}As_{0.57}Sb_{0.43}$ sub-layer and $AlAs_{0.16}Sb_{0.84}$ sub-layer is kept constant at 12 angstroms. By varying the thickness of the InAs sub-layer, the cut-off wavelength for the $InAs/In_{0.5}Al_{0.5}As_{0.57}Sb_{0.43}$ SLS structure can be tuned in the range of about 2.3 μm to almost 3 μm, while that for the $InAs/AlAs_{0.16}Sb_{0.84}$ SLS structure can be tuned in the range of about 1.3 μm to about 2.3 μm.

Figure 5:
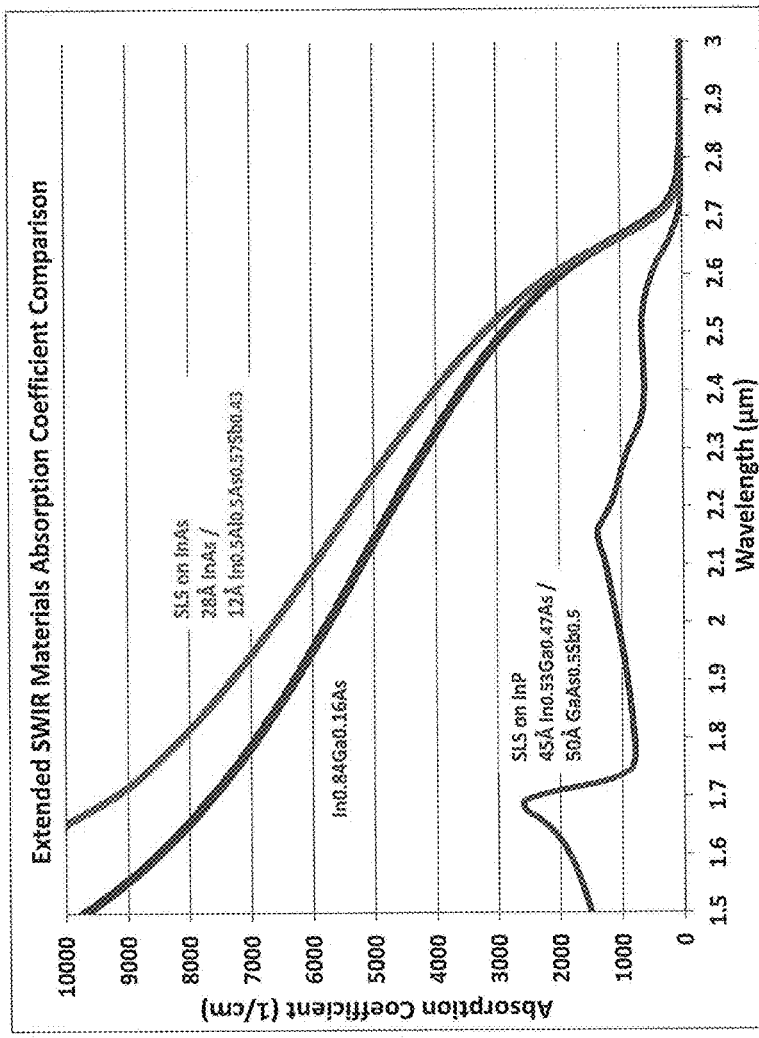
FIG. 5 shows a graph illustrating the absorption coefficient of an InAs/In$_{0.5}$Al$_{0.5}$As$_{0.57}$Sb$_{0.43}$ superlattice (SLS)

FIG. 5 compares the optical absorption coefficient of an InAs/InAlAsSb SLS structure on an InAs substrate with InGaAs and an InGaAs/GaAsSb SLS structure on an InP substrate. As can be seen, the InAs/InAlAsSb SLS structure shows similar absorption to InGaAs and better absorption than the InGaAs/GaAsSb SLS structure. The InAs/InAlAsSb SLS structure exhibits very high absorption.

FIG. 6A illustrates a flat-band energy profile for a PIN detector using an InAs/InAlAsSb SLS with a 2.6 μm cut-off wavelength.

FIG. 6B illustrates a flat-band energy profile for a NBN detector using an InAs/InAlAsSb SLS as an absorber and contact material with a 2.6 μm cut-off wavelength. The high band-gap electron barrier can be a closely lattice matched AlAsSb or InAlAsSb alloy to the InAs substrate. As can be seen, there is minimal offset in the valence band so that photo-generated holes can move freely from the SLS absorber 610 to the top contact layer 605. In other words, there is little to no energy level offset that blocks the carriers.

Another possible detector is a PBN detector, where the absorber is n-type. Below is a description of an exemplary PBN device. The SLS is thicker at 1 μm to provide higher quantum efficiency.

TABLE 1

Layer Composition and Doping of SLS PBN Device

| Layer # | Description | Composition | Doping type |
|---|---|---|---|
| 5 | Contact | InAs | P |
| 4 | Barrier | $AlAs_{0.16}Sb_{0.84}$ | N |
| 3 | Absorber | SLS (InAs/InAlAsSb) | N |
| 2 | Etch-Stop | $AlAs_{0.16}Sb_{0.84}$ | N |
| 1 | Buffer | InAs | N |
| 0 | Substrate | InAs | — |

FIG. 7 illustrates a diagram of an etched PBN diode 700, including a top metal 705, p-type InAs top contact 710, AlAsSb etch-stop 715, etched SLS 720, and bulk SLS 725. Details regarding the different layers are provided in Table 1.

FIG. 8 illustrates a flat-band energy profile for the PBN detector of Table 1 having a top metal 805, AlAsSb etch-stop 815, and InAs/InAlAsSb 820/825 as absorber and contact material with a 2.6 μm cut-off wavelength. The high band-gap electron barrier can be a closely matched AlAsSb or InAlAsSb alloy to the InAs substrate.

A thin InAs p-contact is used, as well as an $AlAs_{0.16}Sb_{0.84}$ etch-stop that blocks majority electrons in the conduction band. The composition and doping of the layers are designed such that the valence band offset between the barrier and absorber is closer to zero to allow the transport of minority holes to the p-contact.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An infrared detector comprising:
    an InAs substrate; and
    a strain-layered superlattice including:
        a first sub-layer comprising InAs on the InAs substrate;
        a second sub-layer directly on the first sub-layer comprising InAlAsSb;
        a third sub-layer comprising InAs on the second sub-layer; and
        a fourth sub-layer comprising InAlAsSb directly on the third sub-layer.

2. The infrared detector of claim 1, wherein a thickness of the first sub-layer ranges from about 10 to 50 angstroms and wherein a thickness of the second sub-layer ranges from about 10 to 30 angstroms.

3. The infrared detector of claim 1, wherein the InAlAsSb is present as $In_{0.2}Al_{0.8}As_{0.30}Sb_{0.7}$, $In_{0.5}Al_{0.5}As_{0.5}Sb_{0.5}$, or $In_{0.5}Al_{0.5}As_{0.57}Sb_{0.43}$.

4. The infrared detector of claim 1, wherein the infrared detector detects infrared wavelengths of about 1 μm to 3 μm.

5. A structure comprising:
    an InAs substrate;
    a strain-layered superlattice including:
        a first sub-layer comprising InAs on the InAs substrate;
        a second sub-layer directly on the first sub-layer comprising InAlAsSb; and
        a plurality of periods on the second sub-layer, each of the plurality of periods including:
            a third sub-layer comprising InAs; and
            a fourth sub-layer adjacent to the third sub-layer comprising InAlAsSb.

6. The structure of claim 5, wherein a thickness of the first sub-layer and the third sub-layer in each of the plurality of periods ranges from about 10 to 50 angstroms, and wherein a thickness of the second sub-layer and the fourth sub-layer in each of the plurality of periods ranges from about 10 to 30 angstroms.

7. The structure of claim 5, wherein the InAlAsSb is present as $In_{0.2}Al_{0.8}As_{0.30}Sb_{0.7}$, $In_{0.5}Al_{0.5}As_{0.5}Sb_{0.5}$, or $In_{0.5}Al_{0.5}As_{0.57}Sb_{0.43}$.

8. The structure of claim 5, which detects infrared wavelengths of about 1 μm to 3 μm.

9. The structure of claim 5, wherein the structure is doped n-type.

10. An infrared detector comprising the structure of claim 5 in an absorber region of the infrared detector.

11. An infrared camera, comprising a focal plane array comprising the infrared detector of claim 10.

12. A PIN (p-doped semiconductor layer, intrinsic detector layer, and n-doped semiconductor layer) detector, PBN (p-doped semiconductor layer, barrier layer, and n-doped semiconductor layer), detector, or NBN (n-doped semiconductor layer, barrier layer, and n-doped semiconductor layer) detector comprising the structure of claim 5.

13. A method comprising:
providing an InAs substrate;
forming a strain-layered superlattice by:
  depositing a first sub-layer of InAs on the InAs substrate;
  depositing a second sub-layer of InAlAsSb directly on the first sub-layer;
  depositing a third sub-layer of InAs on the second sub-layer; and
  depositing a fourth sub-layer of InAlAsSb directly on the third sub-layer.

14. The method of claim 13, wherein:
depositing the second sub-layer comprises epitaxially growing the InAlAsSb on the first sub-layer; and
forming the strain-layered superlattice further comprises forming a plurality of periods on the fourth sub-layer, each of the plurality of periods including:
  a fifth sub-layer comprising InAs; and
  a sixth sub-layer directly on the fifth sub-layer comprising InAlAsSb.

15. The method of claim 14, wherein the InAlAsSb is epitaxially grown using molecular beam epitaxy (MBE) or metallo organic chemical vapor deposition (MOCVD).

16. The method of claim 13, wherein a thickness of the deposited second sub-layer is about 10 to 30 angstroms and wherein a thickness of the deposited first sub-layer is about 10 to 50 angstroms.

17. The method of claim 13, further comprising determining a cut-off wavelength for the strain-layered superlattice, and adjusting a thickness of a sub-layer of the strain-layered superlattice based on the cut-off wavelength.

18. A method of forming an infrared detector assembly comprising:
forming the strain-layered superlattice according to the method of claim 13; and
forming at least one infrared detector element over the strain-layered superlattice.

19. The method of claim 18, wherein the infrared detector assembly comprises a PBN (p-doped semiconductor layer, barrier layer, and n-doped semiconductor layer) device.

20. The method of claim 18, wherein the strain-layered superlattice has a thickness of about 1 μm, and wherein the strain-layered superlattice detects infrared wavelengths of about 1 to 3 μm.

* * * * *